(12) United States Patent
Sabater et al.

(10) Patent No.: US 11,436,700 B2
(45) Date of Patent: Sep. 6, 2022

(54) FILTER ARRAY FOR DEMOSAICING

(71) Applicant: InterDigital CE Patent Holdings, Paris (FR)

(72) Inventors: Neus Sabater, Cesson-Sevigne (FR); Benoit Vandame, Cesson-Sevigne (FR); Valter Drazic, Cesson-Sevigne (FR)

(73) Assignee: InterDigital CE Patent Holdings, Paris (FR)

( * ) Notice: Subject to any disclaimer, the term of this patent is extended or adjusted under 35 U.S.C. 154(b) by 0 days.

(21) Appl. No.: 16/965,336

(22) PCT Filed: Jan. 31, 2019

(86) PCT No.: PCT/EP2019/052381
§ 371 (c)(1),
(2) Date: Jul. 28, 2020

(87) PCT Pub. No.: WO2019/149821
PCT Pub. Date: Aug. 8, 2019

(65) Prior Publication Data
US 2021/0118092 A1 Apr. 22, 2021

(30) Foreign Application Priority Data
Jan. 31, 2018 (EP) .................................... 18305098

(51) Int. Cl.
*G06T 3/40* (2006.01)
*G06T 7/536* (2017.01)
*G06T 3/00* (2006.01)

(52) U.S. Cl.
CPC ............ *G06T 3/4015* (2013.01); *G06T 3/005* (2013.01); *G06T 7/536* (2017.01)

(58) Field of Classification Search
CPC ....... G06T 3/4015; G06T 7/536; G06T 3/005; H01L 27/14621
See application file for complete search history.

(56) References Cited

U.S. PATENT DOCUMENTS

| 3,971,065 | A | 7/1976 | Bayer |
| 8,131,071 | B2 | 3/2012 | Linzer |
| 9,240,049 | B2 * | 1/2016 | Ciurea ................. H04N 13/243 |

(Continued)

FOREIGN PATENT DOCUMENTS

| EP | 2683166 A1 * | 1/2014 | ........... G06T 3/4015 |
| EP | 2685726 A1 * | 1/2014 | ......... H04N 9/04557 |

(Continued)

OTHER PUBLICATIONS

Hirakawa K et al, "Spatio-Spectral Color Filter Array Design for Optimal Image Recovery", IEEE Transactions on Image Processing, IEEE Service Center, Piscataway, NJ, JS, vol. 17, No. 10, Oct. 1, 2008, pp. 1876-1890.

*Primary Examiner* — Charles T Shedrick
(74) *Attorney, Agent, or Firm* — Condo Roccia Koptiw LLP (57) ABSTRACT

A device comprising filtering means having a pattern of at least four blocks wherein a second block is located vertical to a first block, a third block is located horizontal to said first block and a fourth block is located vertical to said third block and horizontal to said second block; and means to generate a new image from images captured using said filtered rays.

20 Claims, 7 Drawing Sheets

(56) References Cited

U.S. PATENT DOCUMENTS

| | | | |
|---|---|---|---|
| 9,300,932 B2 * | 3/2016 | Knight | H04N 9/04 |
| 9,807,368 B2 * | 10/2017 | Vandame | H04N 13/257 |
| 10,110,869 B2 * | 10/2018 | Kumar | H04N 9/045 |
| 2010/0238330 A1 | 9/2010 | Hirota | |
| 2014/0146201 A1 * | 5/2014 | Knight | G02B 27/0075 |
| | | | 348/231.99 |
| 2017/0048513 A1 * | 2/2017 | Vandame | G06T 7/557 |
| 2017/0094210 A1 | 3/2017 | Galor et al. | |

FOREIGN PATENT DOCUMENTS

| | | | |
|---|---|---|---|
| EP | 3131292 A1 * | 2/2017 | G06T 7/557 |
| EP | 3131292 A1 | 2/2017 | |
| EP | 3462724 A1 * | 4/2019 | H04N 5/2175 |
| EP | 3522106 A1 * | 8/2019 | G06T 7/536 |
| GB | 2505954 B | 5/2017 | |
| WO | WO-2012124184 A1 * | 9/2012 | H04N 9/04557 |
| WO | WO-2013183379 A1 * | 12/2013 | G06T 3/4015 |
| WO | WO-2014030390 A1 * | 2/2014 | G06T 3/4015 |
| WO | WO-2019109182 A1 * | 6/2019 | H04N 13/232 |

* cited by examiner

FILTER ARRAY FOR DEMOSAICING

CROSS REFERENCE TO RELATED APPLICATIONS

This application is the national stage entry under 35 U.S.C. § 371 of International Application PCT/EP2019/052381, filed Jan. 31, 2019, which was published in accordance with PCT Article 21(2) on Aug. 8, 2019 in English and which claims the benefit of European patent application 18305098.8, filed Jan. 31, 2018.

TECHNICAL FIELD

The present disclosure relates to color filter arrays embedded in plenoptic camera. Particularly but not exclusively, the disclosure relates to a color filter array capable of providing colored sub-aperture images and automatically demosaicing refocused images for any integer disparity.

BACKGROUND

A plenoptic camera is able to measure the amount of light traveling along each bundle of rays that intersects a sensor, by arranging a microlens array between a main lens and the sensor. The data acquired by such a camera are called light-field data. These light-field data can be post-processed to reconstruct images of a scene from different viewpoints. The light-field data can be used to generate a focal stack which comprises a collection of images each having different re-focusing depth. As a result, a user can change the focus distance of the images. Compared to a conventional camera, the plenoptic camera can obtain additional optical information components for achieving the reconstruction of the images of a scene from the different viewpoints and re-focusing depth by post-processing.

Figure 1:
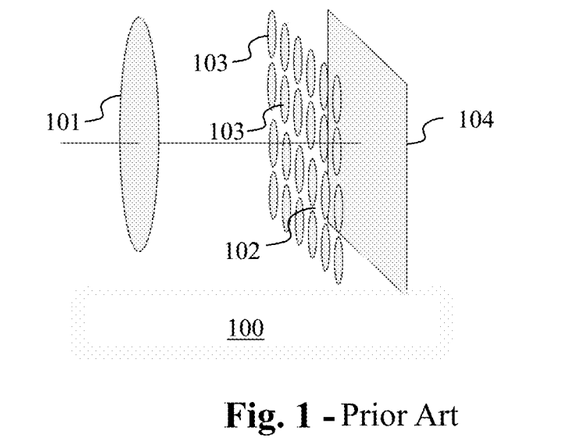
FIG. 1 is a diagram schematically representing a plenoptic camera.

FIG. 1 is a diagram schematically representing a plenoptic camera 100. As mentioned above, light-field cameras are capable of recording four-dimensional (or 4D) light-field data. The plenoptic camera 100 comprises a main lens 101, a microlens array 102 and a pixels sensor 104.

In the example of the plenoptic camera 100 as shown in FIG. 1, the main lens 101 receives light from an object (not shown on the figure) in an object field of the main lens 101 and passes the light through an image field of the main lens 101. The microlens array 102 includes a plurality of microlenses 103 arranged in a two-dimensional array.

Color-Filter-Array (CFA) are commonly used to sample various colors with pixels performing a single measure. The most common CFA pattern is the Bayer pattern made of 2 by 2 elements and disclosed in the U.S. Pat. No. 3,971,065.

Bayer color filter array lets one color Red, Green or Blue to be recorded by a pixel of a pixels sensor. From the raw image captured with a sensor to a color image, where each pixel is characterized by three colors values, it is mandatory to compute the two missing colors per pixel. This computation is named the demosaicing.

Since Bayer color filter array is also used with plenoptic cameras, 4D light-field data acquired with such plenoptic cameras also require a demosaicing which can be performed at the stage of computing the two-dimensional (2D) refocused images.

Figure 2A:
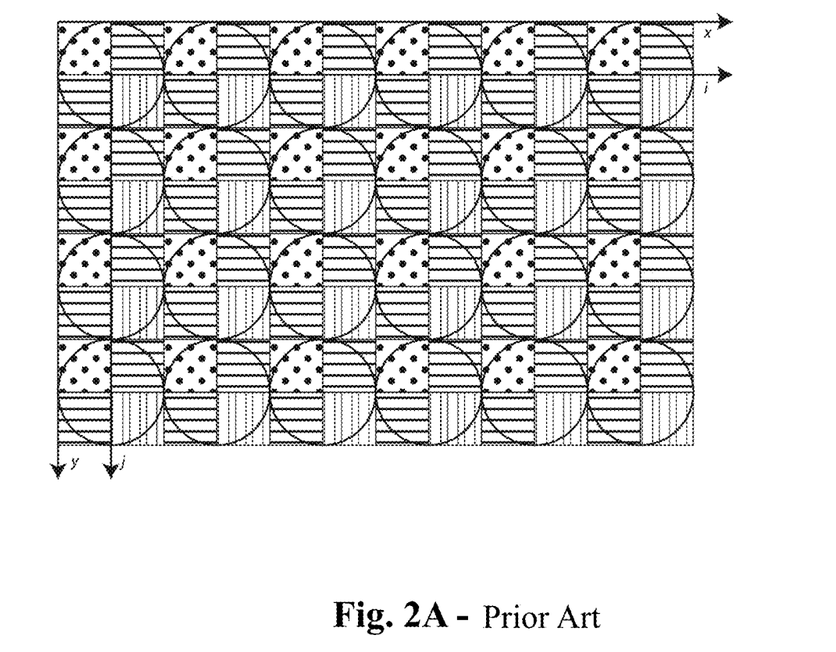
FIG. 2A represents a Bayer color filter array positioned on top of the pixels sensor.

Typically, a Bayer color filter array is positioned on top of the pixels sensor 104 as shown on FIG. 2A.

Figure 2B:
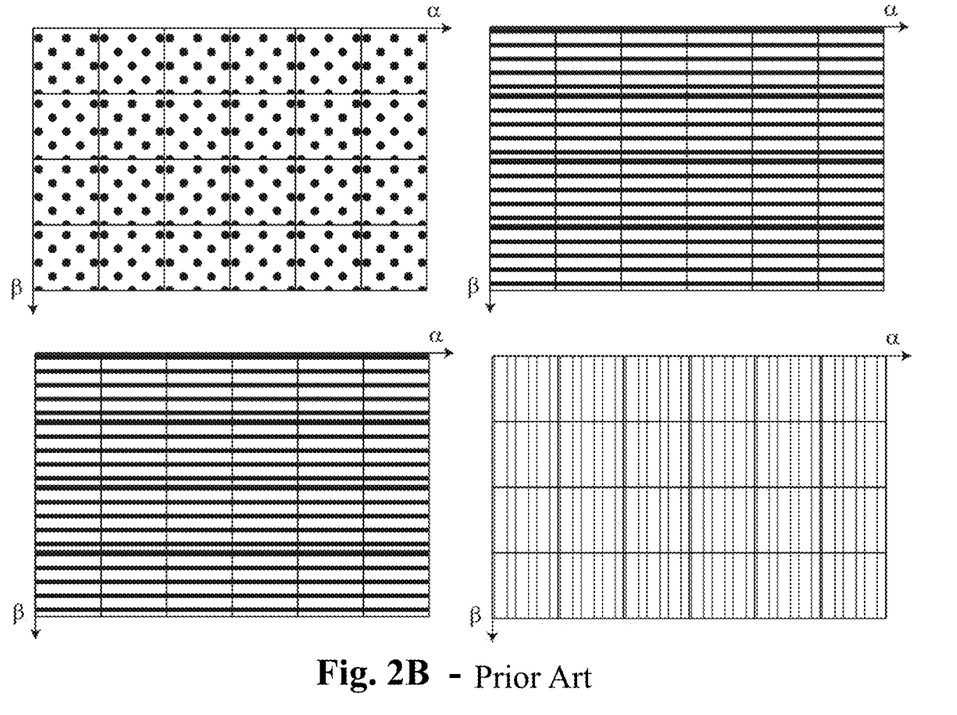
FIG. 2B represents 4 sub-aperture images acquired with a plenoptic camera.

Color sampling of re-focused 2D images depends on the color sampling of the plenoptic camera used to acquire the light-field data. FIG. 2A illustrates the sensor with micro-images covering 2 by 2 pixels. The 4 sub-aperture images are illustrated in FIG. 2B. Refocused images are computed by superposition of the 4 sub-aperture images with a given shift (disparity) corresponding to the focalization distance. For any shift, each re-focused pixel receives the contribution of all the different colors from the Bayer color filter array when it is set on top of the pixels as represented on FIG. 2A. Such a positioning of the Bayer color filter array seems promising since it delivers demosaiced images whatever is the re-focusing parameter $\rho_{focus}$. But this design is not able to produce good images of objects which are not in focus in the refocus images.

In order to overcome this drawback, the inventors of the present disclosure filed a patent application EP 3 131 292. In this patent application a color filter array with a pattern of size M×M dedicated to a plenoptic camera is disclosed.

Figure 3A:
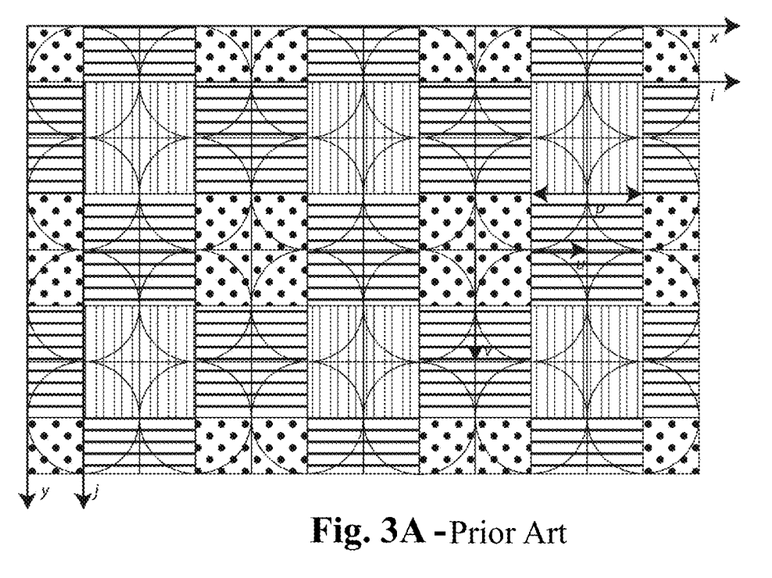
FIG. 3A represents a color filter array pattern with $M^2$ colors $c_{m,n}$ with $(m,n) \in [0,M[$ according to the prior art.
Figure 3B:
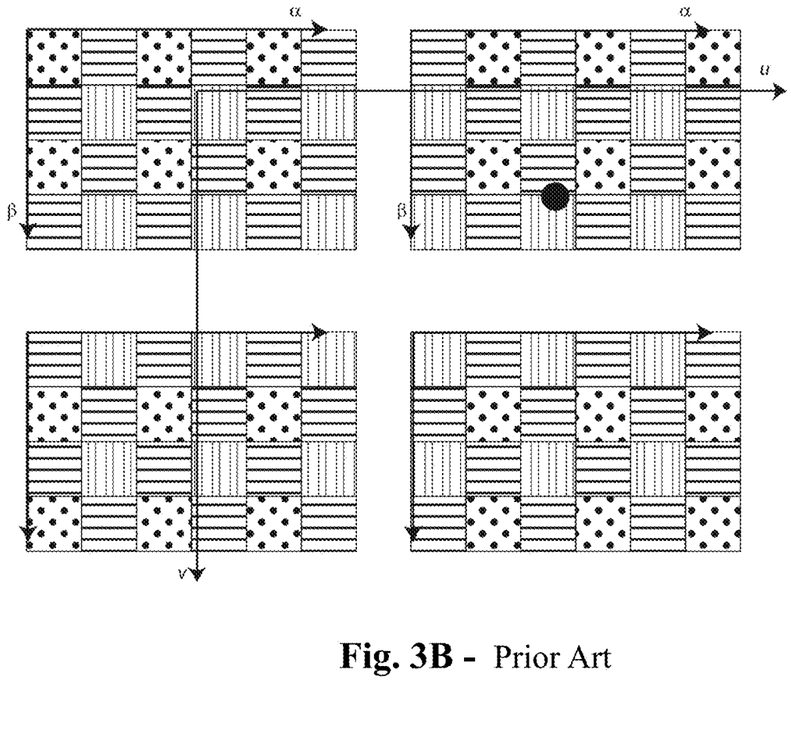
FIG. 3B represents a color filter array with "shuffled" colors according to the prior art.

Patent application EP 3 131 292 discloses a color filter array pattern with $M^2$ colors $c_{m,n}$ with $(m,n) \in [0,M[$. The color applied on the pixel $(x,y,i,j)$ is set to $c_{(x+i) \mod M, (y+j) \mod M}$ as shown on FIG. 3A. It results into a new color filter array made of pM×pM covering the pixels. The original color filter array is covering the p×p pixels, the other pixels belonging to the micro-lens (i,j) are covered with the original color filter array but with "shuffled" colors as shown on FIG. 3B.

The sub-aperture images are covered with the color filter array of $M^2$ colors. But the starting colors of the sub-aperture image $S_{u,v}$ is $c_{u,v}$ (and not $c_{0,0}$ for the common case where the original color filter array is covering the pixels). This design makes re-focused images to be perfectly de-mosaiced for $\rho_{focus} = -M, 0, +M \ldots$ . Also this new design is not affected by color artifacts for object observed out-of-focus.

The present disclosure has been devised with the foregoing in mind.

SUMMARY

A first aspect relates to a method, comprising filtering rays of a camera using a pattern having at least four blocks wherein a second block is located vertical to a first block, a third block is located horizontal to said first block and a fourth block is located vertical to said third block and horizontal to said second block; and generating a new image from images captured using said filtered rays.

Another aspect relates to a device comprising filtering means having a pattern of at least four blocks wherein a second block is located vertical to a first block, a third block is located horizontal to said first block and a fourth block is located vertical to said third block and horizontal to said second block; and means to generate a new image from images captured using said filtered rays In an embodiment there is provided a filter array intended to be positioned on a pixels sensor of a plenoptic camera, said filter array comprising a pattern which is replicated to cover the whole pixels sensor, wherein said pattern:

covers 2p×2p pixels of said pixels sensor, where p is an even number of pixels corresponding to a diameter of a micro-lens image produced by a micro-lens of a micro-lens array embedded in said plenoptic camera, and comprises four blocks arranged such that a second block is located below a first block, a third block is located on the right of said first block and a fourth block is located below said third block and on the right of said second block, a block covering p×p pixels of said pixels sensor and comprising four sub-blocks, a sub-block covering pixels of said pixels sensor and corresponding to a filter value, said second block being obtained by permuting columns of said sub-blocks of said first block, said third block being obtained by permuting rows of said sub-blocks of said second block, and said fourth block being obtained by permuting columns of said sub-blocks of said third block.

As discussed previously, for some integer disparities the refocused images are automatically demosaiced thanks to the favorable merging of the sub-aperture images; whereas for other integer disparities the refocused images remain mosaicked due to the strict superposition of the pattern of Bayer color filter array of the shifted sub-aperture images. Contrary to the solutions of the prior arts, the filter array according to an embodiment of the invention cumulates the advantage of providing colored sub-aperture images and of automatically demosaicing refocused images for any integer disparity.

In an embodiment said filtering means comprises a filter array for positioning on a pixels sensor of a plenoptic camera.

The proposed pattern of the filter array according to an embodiment is addresses theses issues by means of a smart pattern of the filter elements which permit to cumulate these two advantages.

According to an embodiment, the pattern of the filter array is given by the following matrix:

$$FA_1 = \begin{matrix} a & c & d & b \\ b & d & c & a \\ c & a & b & d \\ d & b & a & c \end{matrix}$$

Where a, b, c and d are the filter elements.

With such a pattern the sub-aperture images are showing all the possible patterns of a filter array according to an embodiment of the invention. Thus, a refocused image with an integer disparity $\rho=0(2)$ (0 modulo 2) is fully demosaiced, as well as a refocused image with an integer disparity $\rho=1(2)$.

According to an embodiment of the invention, the pattern of the filter array is the transpose of said matrix $FA_1$ and is given by the following matrix:

$$FA_2 = \begin{matrix} a & b & c & d \\ c & d & a & b \\ d & c & b & a \\ b & a & d & c \end{matrix}$$

Where a, b, c and d are the filter elements.

According to an embodiment of the invention, the filter array is a polarization filter.

According to an embodiment of the invention, the filter array is a density filter.

According to an embodiment of the invention, the filter array is a color filter.

The color filter may be for example a RGBE filter comprising red, green, blue and "emerald" filter elements, or a CYYM filter comprising one cyan, two yellow, and one magenta filter elements, or a CYGM filter comprising cyan, yellow, green and magenta filter elements.

According to an embodiment of the invention, the said color filter is a Bayer filter, two sub-blocks of a block corresponding to a green (G) filter element, and two other sub-blocks of said block corresponding respectively to a blue (B) filter element and to a red (R) filter element.

According to an embodiment of the invention, the said four sub-blocks being arranged such that a second sub-block is located below a first sub-block, a third sub-block is located on the right of said first sub-block and a fourth sub-block is located below said third sub-block and on the right of said second sub-block, and wherein the first and the second sub-blocks corresponding to a same filter element or the third and the fourth sub-blocks corresponding to a same filter element.

Another aspect concerns a pixels sensor of a plenoptic camera on which a filter array according to an embodiment of the invention is positioned.

An embodiment relates to a plenoptic camera comprising a pixels sensor on which a filter array according to an embodiment of is positioned.

An embodiment relates to computer program product comprising instructions which when executed by a processor cause the processor to perform the method of the embodiments.

BRIEF DESCRIPTION OF THE DRAWINGS

Embodiments will now be described, by way of example only, and with reference to the following drawings in which.

DETAILED DESCRIPTION

As will be appreciated by one skilled in the art, aspects of the present principles can be embodied as a system, method or computer readable medium. Accordingly, aspects of the present principles can take the form of an entirely hardware embodiment, an entirely software embodiment, (including firmware, resident software, micro-code, and so forth) or an embodiment combining software and hardware aspects that can all generally be referred to herein as a "circuit", "module", or "system". Furthermore, aspects of the present principles can take the form of a computer readable storage medium. Any combination of one or more computer readable storage medium(a) may be utilized.

Plenoptic cameras, such as the one represented on FIG. 1 record 4D light-field data which can be transformed into many various by-products such as re-focused images with freely selected distances of focalization.

Figure 4:
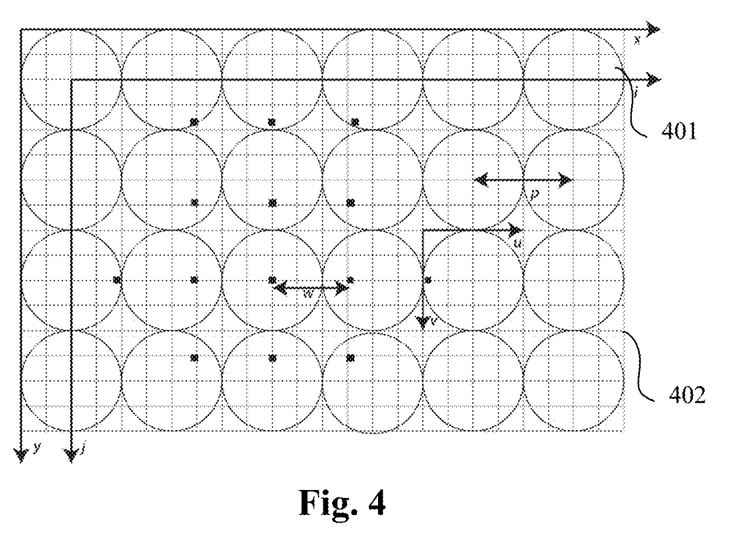
FIG. 4 represents a pixels sensor of a plenoptic camera recording an image which is made of a collection of 2D small images.

As represented on FIG. 4, the pixels sensor 104 of a plenoptic camera records an image which is made of a collection of 2D small images 401, called micro-images, arranged within a 2D image 402. Each micro-image 401 is produced by a micro-lens (i,j) 103 from the array of lens 102. The pixels of the pixels sensor 104 are associated to a 4D coordinates (x,y,i,j). L(x,y,i,j) being the 4D light-field recorded by the pixels sensor 104. Each micro-lens 103 produces a micro-image 401 whose shape depends on the shape of the micro-lenses 103 which is typically circular. Pixels coordinates are labelled (x,y), p is the distance between two consecutive micro-images 401, p is not necessary an integer value. Micro-lenses 103 are chosen such that p is larger than a pixel size δ. Micro-images 401 are referenced by their coordinate (i,j). Each micro-image 401 samples the pupil of the main-lens 101 in a (u,v) coordinate system. The center of a micro-image (i,j) 401 is located on the pixel sensor 104 at coordinates $(x_{i,j}, y_{i,j})$. θ presents an angle between the square lattice of the pixels sensor 104 and the square lattice of the micro-lenses 103, in FIG. 4 θ=0. Assuming the micro-lenses 103 are arranged according to a regular square lattice, the coordinates $(x_{i,j}, y_{i,j})$ may be computed according to the following equation considering $(x_{0,0}, y_{0,0})$ as the pixel coordinates of the micro-lens image (0,0):

$$\begin{bmatrix} x_{i,j} \\ y_{i,j} \end{bmatrix} = p \begin{bmatrix} \cos\theta & -\sin\theta \\ \sin\theta & \cos\theta \end{bmatrix} \begin{bmatrix} i \\ j \end{bmatrix} + \begin{bmatrix} x_{0,0} \\ y_{0,0} \end{bmatrix} \quad (1)$$

FIG. 4 also illustrates that an object from the scene is visible on several contiguous micro-images 401 (dark dots on FIG. 4). The distance between two consecutive views of an object is w. An object is visible on r consecutive micro-images with:

$$r = \left\lfloor \frac{p}{|p-w|} \right\rfloor \quad (2)$$

r is the number of consecutive micro-images 401 in one dimension. An object is visible in $r^2$ micro-images. Depending on the shape of the micro-image, some of the $r^2$ views of the object might be invisible.

The above-mentioned distances p and w are given in unit of pixel. They are converted into physical unit distance (e.g. meters) respectively P and W by multiplying them by the pixel size δ: W=δw and P=δp. These distances depend on the light-field camera characteristics.

Figure 5A:
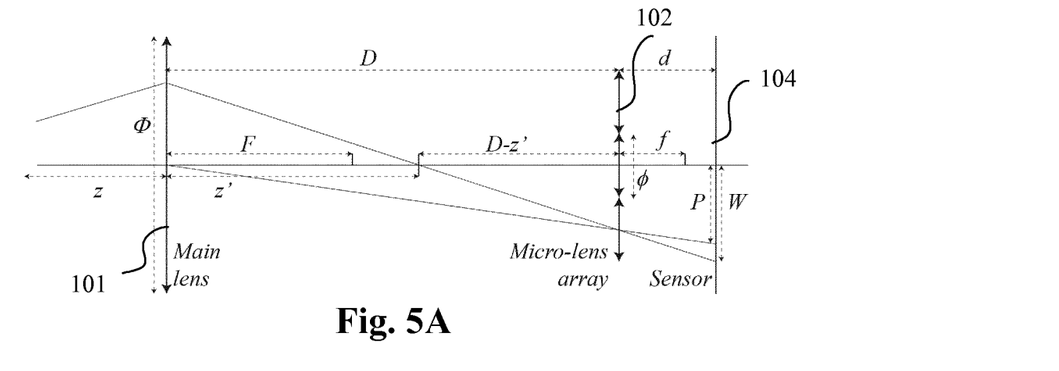
FIGS. 5A and 5B illustrate a schematic light-field assuming perfect thin lens model.
Figure 5B:
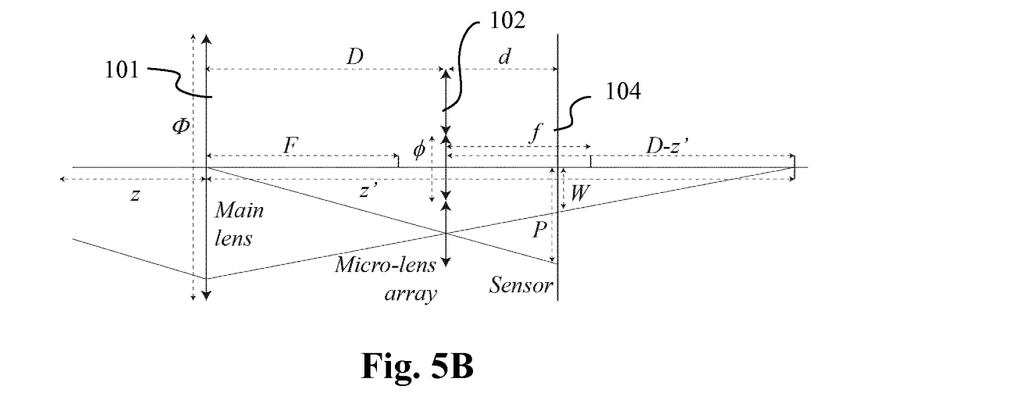

FIGS. 5A and 5B illustrate a schematic light-field assuming perfect thin lens model. The main lens 101 has a focal length F and an aperture Φ. The micro-lens array 102 is made of micro-lenses 103 having a focal length f. The pitch of the micro-lens array 102 is φ. The micro-lens array 102 is located at a distance D from the main lens 101, and a distance d from the pixels sensor 104, called a sensor on FIGS. 5A and 5B. The object (not visible on the figures) is located on the left of FIGS. 5A and 5B at a distance z from the main lens 101. This object is focused by the main lens 101 at a distance z' from the main lens 101 on the right of FIGS. 5A and 5B. FIGS. 5A and 5B illustrate the cases where respectively D>z' and D<z'. In both cases, micro-images 401 can be in focus depending on d and f.

Figure 5C:
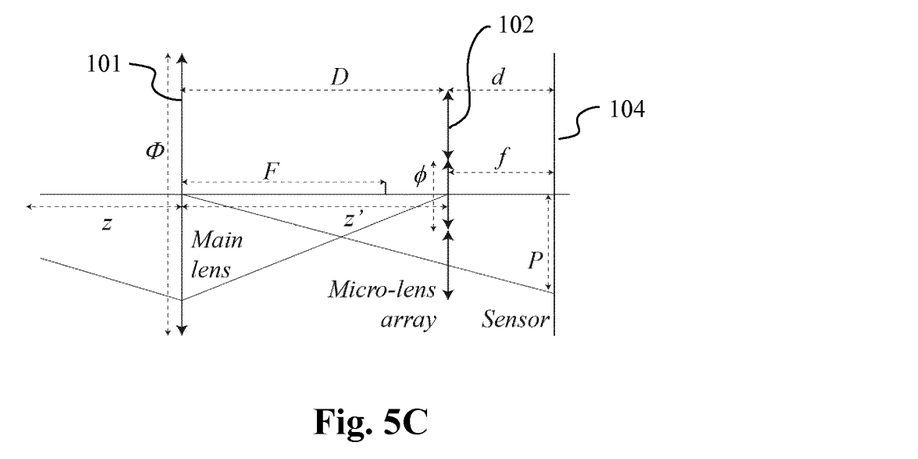
FIG. 5C represents a similar design as on FIGS. 5A and 5B which consists in fixing f=d.

A similar design consists in fixing f=d, as represented on FIG. 5C. This design is made such that the main lens 101 is focusing images close to the micro-lens array 102. If the main lens 101 is focusing exactly on the micro-lens array 102, then W=∞. The micro-images are thus fully out-of-focus and equal to a constant (not considering noise).

The distance W varies with the distance z of the object. To establish the relation between W and z, one relies on the thin lens equation:

$$\frac{1}{z} + \frac{1}{z'} = \frac{1}{F} \quad (3)$$

And the Thales law:

$$\frac{D-z'}{\phi} = \frac{D-z'+d}{W} \quad (4)$$

Combining the two previous equations one deduces:

$$W = \phi \left( 1 + \frac{d}{D - \frac{zF}{z-F}} \right) \quad (5)$$

The relation between W and z does not assume that the micro-images are in focus. Micro-images are strictly in focus according to the thin lens equation:

$$\frac{1}{D-z'} + \frac{1}{d} = \frac{1}{f} \quad (6)$$

Also from the Thales law one derives P $$e = \frac{D+d}{D} \quad (7)$$
$$P = \phi e$$

The ratio e defines the enlargement between the micro-lens pitch and the micro-images pitch. This ratio is very close to 1 since D>>d.

The micro-images 401 can be re-organized into so-called sub-aperture images. A sub-aperture image collects all 4D light-field pixels having the same (u,v) coordinates. Let (I,J) being the number of micro-lenses 103 covering the sensor 104, and $(N_x, N_y)$ the number of pixels of the sensor 104. The number of sub-aperture images is equal to p×p. Each sub-aperture image has a size of $(I,J)=(N_x/p, N_y/p)$ pixels.

Figure 6:
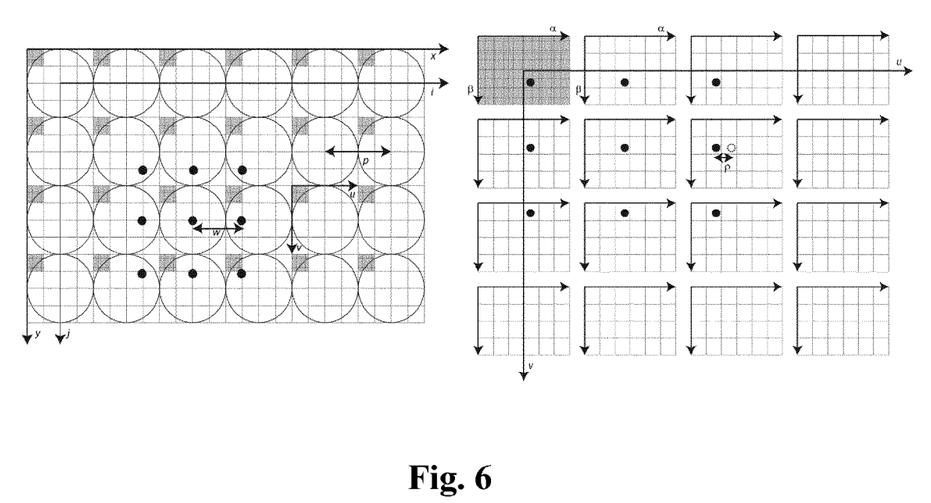
FIG. 6 illustrates the conversion between the captured light-field image coordinates L(x,y,i,j) into a series of sub-aperture images S($\alpha,\beta$,u,v)

FIG. 6 illustrates the conversion between the captured light-field image coordinates L(x,y,i,j) into a series of sub-aperture images S (α,β,u,v). Each sub-aperture image has a size of (I,J) pixels, the axes of the coordinate system are labeled (α,β) with (α,β)∈[0,I[×[0,J[. S(u,v) denotes the 2D image corresponding to the (u,v) pupil coordinate made of I×J pixels.

The relations between (x,y,i,j) and (α,β,u,v) are defined as follow:

$$(\alpha, \beta, u, v) = \left(\left\lfloor \frac{x}{p} \right\rfloor, \left\lfloor \frac{y}{p} \right\rfloor, x \bmod p, y \bmod p\right) \quad (8)$$

Where [.] denotes the floor function, and mod denotes the modulo function.

If p is not exactly an integer but close to an integer, then the sub-aperture images can be computed easily considering the distance between the micro-lens images is equal to ⌊p⌋ the integer just greater than p. This case occurs especially when the micro-lens diameter φ is equal to an integer number of pixels. In this case, p=φe is slightly larger than φ since e=(D+d)/d is slightly greater than 1. The advantage of considering ⌊p⌋ is that the sub-aperture images are computed without interpolation since one pixel L(x,y,i,j) of the pixel sensor 104 corresponds to an integer coordinate sub-aperture pixel S(α,β,u,v). The drawback is that the portion of a pupil from which photons are recorded is not constant within a given sub-aperture image S(u,v). To be precise, S(u,v) sub-aperture image is not exactly sampling the (u,v) pupil coordinates. If p is not an integer, or if the micro-lens array is rotated versus the pixel array, then the sub-aperture images need to be computed using interpolation since the centers $(x_{i,j}, u_{i,j})$ of the micro-lenses are not integer.

Within a light-field image L(x,y,i,j) an object is made visible on several micro-images with a replication distance w. On the sub-aperture images, an object is also visible several times. From one sub-aperture image to the next horizontal one, an object coordinate (α,β) appears shifted by the disparity ρ. The relation between ρ and w is defined by:

$$\rho = \frac{1}{w - p} \quad (9)$$

Also it is possible to establish a relation between the disparity ρ and the distance z of the object by mixing equations (5) and (9):

$$\rho = \frac{\delta D}{\phi d} \left( \frac{D}{z'} - 1 \right) \quad (10)$$

Image refocusing consists in projecting the light-field pixels L(x,y,i,j) recorded by the sensor into a 2D refocused image of coordinate (X,Y). The projection is performed by shifting the micro-images (i,j):

$$\begin{bmatrix} X \\ Y \end{bmatrix} = s \begin{bmatrix} x \\ y \end{bmatrix} - s w_{focus} \begin{bmatrix} i \\ j \end{bmatrix} \quad (11)$$

Where $w_{focus}$ is the selected replication distance corresponding to $z_{focus}$ the distance of the objects that appear in focus in the computed refocused image, s is a zoom factor which controls the size of the refocused image. The value of the light-field pixel L(x,y,i,j) is added on the refocused image at coordinate (X,Y). If the projected coordinate is non-integer, the pixel is added using interpolation. To record the number of pixels projected into the refocus image, a weight-map image having the same size than the refocus image is created. This image is preliminary set to 0. For each light-field pixel projected on the refocused image, the value of 1.0 is added to the weight-map at the coordinate (X,Y). If interpolation is used, the same interpolation kernel is used for both the refocused and the weight-map images. After, all the light-field pixels are projected, the refocused image is divided pixel per pixel by the weight-map image. This normalization step, ensures brightness consistency of the normalized refocused image.

Equivalently, the refocused images can be computed by summing-up the sub-aperture images S(α,β) taking into consideration the disparity $\rho_{focus}$ for which objects at distance $z_{focus}$ are in focus.

$$\begin{bmatrix} X \\ Y \end{bmatrix} = s \begin{bmatrix} \alpha \\ \beta \end{bmatrix} + s\rho_{focus} \begin{bmatrix} u \\ v \end{bmatrix} \quad (12)$$

The sub-aperture pixels are projected on the refocused image, and a weight-map records the contribution of this pixel, following the same procedure described above.

Figure 7:
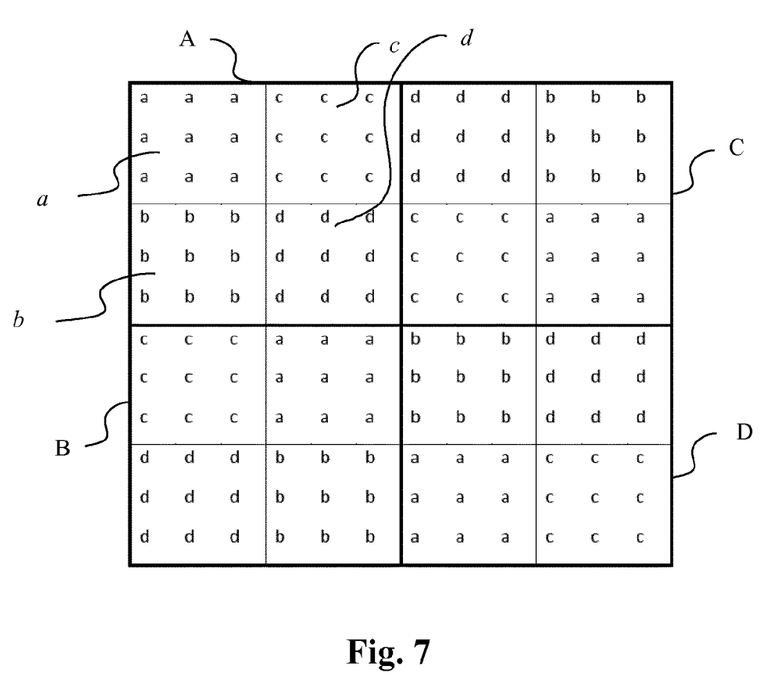
FIG. 7 presents a filter array according to an embodiment of the invention comprising a pattern which is replicated to cover the whole pixels sensor.

Embodiments of the disclosure concern a filter array for plenoptic cameras with micro-lens images having a diameter ρ equal to 2, 4, 6, 8 pixels or any even number of pixels Such filter array, according to an embodiment of the invention, is intended to be positioned on the pixels sensor 104 of a plenoptic camera, said filter array comprises a pattern which is replicated to cover the whole pixels sensor 104 and which is represented on FIG. 7 for p=6.

The pattern of the filter array according to an embodiment of the invention covers 2p×2p pixels of said pixels sensor 104 and comprises four blocks A B, C and D arranged such that the second block B is located below the first block A, the third block C is located on the right of said first block A and the fourth block D is located below said third block C and on the right of said second block B. Each block A, B, C and D covers p×p pixels of said pixels sensor 104 and comprises four sub-blocks a, b, c and d. A sub-block a, b, c and d covers $$\frac{p}{2} \times \frac{p}{2}$$

pixels of said pixels sensor 104 and corresponds to a filter value. The filter elements constituting the sub-blocks a, b, c and d may be filter elements of any kind such as color, polarization, or density . . . .

The second block B is obtained by permuting the columns of the sub-blocks a, b, c and d of the first block A, the third block C i obtained by permuting rows of the sub-blocks a, b, c and d of the second block B, and the fourth block is obtained by permuting columns of the sub-blocks a, b, c and d of the third block C as show on FIG. 7 and by the following equation (which is given for p=4):

$$FA[4]_1 = \begin{matrix} a & a & c & c & d & d & b & b \\ a & a & c & c & d & d & b & b \\ b & b & d & d & c & c & a & a \\ b & b & d & d & c & c & a & a \\ c & c & a & a & b & b & d & d \\ c & c & a & a & b & b & d & d \\ d & d & b & b & a & a & c & c \\ d & d & b & b & a & a & c & c \end{matrix} \quad (13)$$

In an embodiment, the filter array is made of the three colors Red, Green and Blue. In others embodiment of the invention, the color filter may be for example a RGBE filter comprising red, green, blue and "emerald" filter elements, or a CYYM filter comprising one cyan, two yellow, and one magenta filter elements, or a CYGM filter comprising cyan, yellow, green and magenta filter elements.

Figure 8A:
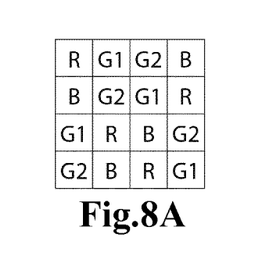
FIGS. 8A-8C represent respectively four possible Bayer patterns replicated on the sensor as well as the corresponding 2 by 2 sub-aperture images.

In the case where filter array is made of the three colors Red, Green and Blue, the proposed pattern enables the sub-aperture images to show the four possible Bayer patterns as shown on FIG. 8A where a=R, b=B, c=G1 and d=G2. Thus, a refocused image with an integer disparity $\rho=0(2)$ (0 modulo 2) is fully demosaiced, as well as for integer disparity $\rho=1(2)$. In this embodiment of the invention, two sub-blocks of the four sub-blocks a, b, c and d are identical (as it is the case for the Bayer pattern) such that: $a \neq c$, $a \neq d$, $c \neq b$ and $b \neq d$. Or in other words, either c=d or b=a.

The proposed solution is characterized by two possible filter arrays, e.g. of 4 by 4 pixels defined as follows:

$$FA_1 = \begin{matrix} a & c & d & b \\ b & d & c & a \\ c & a & b & d \\ d & b & a & c \end{matrix} \quad (14)$$

$$FA_2 = \begin{matrix} a & b & c & d \\ c & d & a & b \\ d & c & b & a \\ b & a & d & c \end{matrix} \quad (15)$$

Where $FA_2$ is the transposed version of $FA_1$.

Figure 8B:
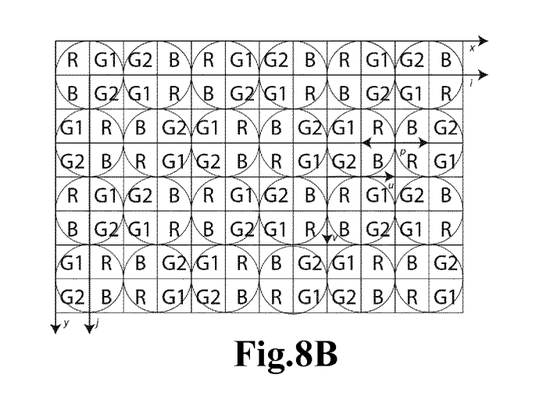
Figure 8C:
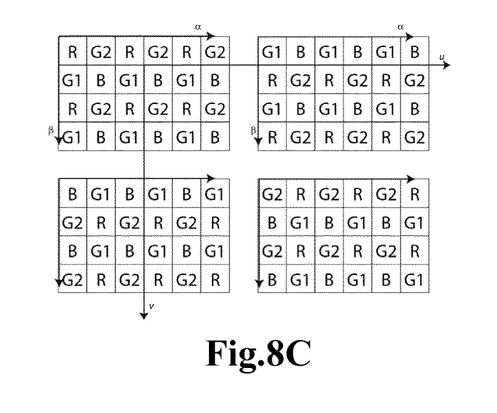

As illustrated on FIG. 8A, this filter array is applied and replicated on the sensor as shown in FIG. 8B. The micro-images 401 diameter is p=2 pixels. The corresponding 2 by 2 sub-aperture images are illustrated in FIG. 8C. The superposition of the four sub-aperture images with integer disparity makes the refocus image to be naturally demosaiced. One notes that the 4 sub-apertures images are showing the classical Bayer patterns (2 by 2 pixels) rotated between the 4 sub-aperture images. Thus, each sub-aperture image samples the 3 colors.

Figure 9A:
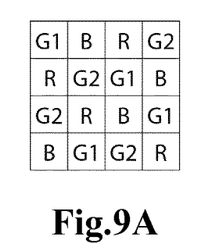
FIGS. 9A-9C represent respectively a filter array $FA_2$ applied and replicated on the sensor as well as the 2 by 2 sub-aperture images.
Figure 9B:
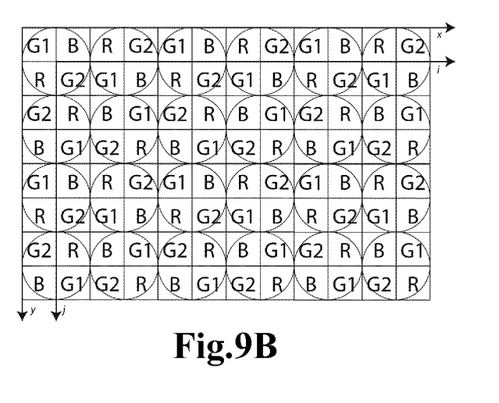
Figure 9C:
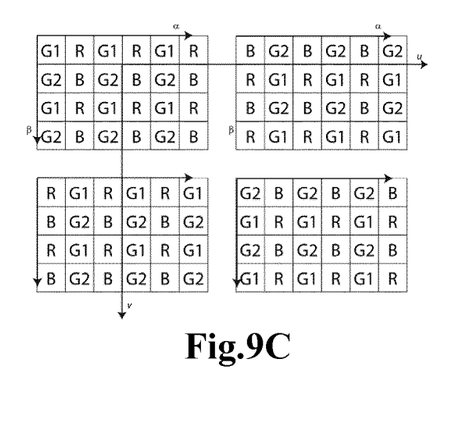

FIG. 9A illustrates the Filter Array $FA_2$ with a=G1, b=R, c=B and d=G2. This filter array is applied and replicated on the sensor as shown in FIG. 9B. The micro-images diameter is p=2 pixels. The 2 by 2 sub-aperture images are illustrated in FIG. 9C. The superposition of the 4 sub-aperture images with integer disparity makes the refocus image to be naturally demosaiced. One notes that the 4 sub-apertures images are showing a special Color Filter Array of 2 by 2 pixels. Indeed, the constraint either c=d or b=a is not respected in this embodiment of the invention.

According to the different embodiments, whatever the integer shift used to compute a refocused image the resulting image is fully demosaiced. With disparity $\rho=0$ the sub-aperture images are superposed which delivers a refocused image naturally demosaiced. With an integer disparity $\rho \neq 0$, the sub-aperture images S(u,v) are shifted by $[u\rho, v\rho]$ pixels before being superposed with the other ones. For any integer disparity $\rho$ the refocused image is also naturally demosaiced.

Having several pixels bellow a micro-lens 103 is nowadays available in various cameras. Having two pixels bellow a micro-lens 103 is called "dual-pixel" and by extension having 2 by 2 pixels bellow a micro-lens 103 is called "quad-pixel".

This technology is preliminarily used for live autofocus when shooting video. It is also used to help algorithms computing images with a shallow depth-of-field and presenting a bokeh as if the images were shot with a large sensor camera.

With quad-pixel sensors, new applications will be available such as: 1/tight refocusing, 2/main-lens aberration correction.

One major drawback of quad-pixel sensor is the variability of the spatial resolution of the refocused images. This drawback is solved by positioning a filter array according an embodiment of invention and whose pattern covers of 4 by 4 pixels.

Although the present embodiments have been described hereinabove with reference to specific embodiments, the present disclosure is not limited to the specific embodiments, and modifications will be apparent to a skilled person in the art which lie within the scope of the claims.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. A method, comprising:
    filtering rays of a camera using a pattern having at least four blocks wherein a second block is located vertical to a first block, a third block is located horizontal to said first block and a fourth block is located vertical to said third block and horizontal to said second block;
    wherein, a block covers p×p pixels of a pixels sensor and comprises four sub-blocks, a sub-block cover $$\frac{p}{2} \times \frac{p}{2}$$

pixels of said pixels sensor and corresponds to a filter value, said second block being obtained by permuting columns of said sub-blocks of said first block, said third block being obtained by permuting rows of said sub-blocks of said second block, and said fourth block being obtained by permuting columns of said sub-blocks of said third block, and wherein the pattern is given by the following matrix:

$$FA_1 = \begin{matrix} a & c & d & b \\ b & d & c & a \\ c & a & b & d \\ d & b & a & c \end{matrix}$$

where a, b, c and d are filter elements; and
generating a new image from images captured using said filtered rays.

2. The method of claim 1, wherein said pattern is replicated at least twice to cover a surface of a pixels sensor of a plenoptic camera.

3. The method of claim 1, wherein said pattern covers 2p×2p pixels instead and, where p is an even number of pixels corresponding to a diameter of a micro-lens image produced by a micro-lens of a micro-lens array of a plenoptic camera.

4. The method of claim 1, wherein the pattern is the transpose of said matrix $FA_1$ and is given by the following matrix:

$$FA_2 = \begin{matrix} a & b & c & d \\ c & d & a & b \\ d & c & b & a \\ b & a & d & c \end{matrix}$$

where a, b, c and d are the filter elements.

5. A device comprising,
a filtering means having a pattern of at least four blocks wherein a second block is located vertical to a first block, a third block is located horizontal to said first block, and a fourth block is located vertical to said third block and horizontal to said second block;
wherein, a block covers p×p pixels of a pixels sensor and comprises four sub-blocks, a sub-block covers $$\frac{p}{2} \times \frac{p}{2}$$

pixels of said pixels sensor and corresponds to a filter value, said second block being obtained by permuting columns of said sub-blocks of said first block, said third block being obtained by permuting rows of said sub-blocks of said second block, and said fourth block being obtained by permuting columns of said sub-blocks of said third block, and wherein the pattern is given by the following matrix:

$$FA_1 = \begin{matrix} a & c & d & b \\ b & d & c & a \\ c & a & b & d \\ d & b & a & c \end{matrix}$$

where a, b, c and d are filter elements; and
a processor configured to generate a new image from images captured using filtered rays.

6. The device of claim 5, wherein said pattern is replicated at least twice to cover a surface of a pixels sensor of a plenoptic camera.

7. The device of claim 5, wherein said pattern covers 2p×2p pixels of said pixels sensor, where p is an even number of pixels corresponding to a diameter of a micro-lens image produced by a micro-lens of a micro-lens array of a plenoptic camera.

8. The device of claim 5, wherein the pattern is the transpose of said matrix $FA_1$ and is given by the following matrix:

$$FA_2 = \begin{matrix} a & b & c & d \\ c & d & a & b \\ d & c & b & a \\ b & a & d & c \end{matrix}$$

where a, b, c and d are the filter elements.

9. The device of claim 5, wherein said filtering means comprises at least one of a polarization filter, a density filter, or a color filter.

10. The device of claim 9, wherein said color filter is a Bayer filter, two sub-blocks of a block corresponding to a green (G) filter element, and two other sub-blocks of said block corresponding respectively to a blue (B) filter element and to a red (R) filter element.

11. The device of claim 10, wherein the first and the second sub-blocks correspond to a same filter element or the third and the fourth sub-blocks correspond to a same filter element.

12. A camera comprising the device according to claim 5.

13. The camera of claim 12, wherein said pattern is replicated at least twice to cover a surface of a pixels sensor of a plenoptic camera.

14. The camera of claim 12, wherein said pattern covers 2p×2p pixels of said pixels sensor, where p is an even number of pixels corresponding to a diameter of a micro-lens image produced by a micro-lens of a micro-lens array of a plenoptic camera.

15. The camera of claim 12, wherein said filtering means comprises at least one of a polarization filter, a density filter, or a color filter.

16. The camera of claim 12, wherein said filtering means comprises a color filter, wherein said color filter is a Bayer filter, two sub-blocks of a block corresponding to a green (G) filter element, and two other sub-blocks of said block corresponding respectively to a blue (B) filter element and to a red (R) filter element.

17. The camera of claim 12, wherein the first and the second sub-blocks correspond to a same filter element.

18. The camera of claim 12, wherein the third and the fourth sub-blocks correspond to a same filter element.

19. A device to be positioned on a pixels sensor of a plenoptic camera, comprising:
a filter comprising at least one of a polarization filter, a density filter, or a color filter;
wherein the filter has a pattern of at least four blocks, wherein a second block is located vertical to a first block, a third block is located horizontal to said first block, and a fourth block is located vertical to said third block and horizontal to said second block;
wherein, a block covers p×p pixels of said pixels sensor and comprises four sub-blocks, a sub-block covers sub-pixels covers $$\frac{p}{2} \times \frac{p}{2}$$

pixels of said pixels sensor and corresponds to a filter value, said second block being obtained by permuting columns of said sub-blocks of said first block, said third block being obtained by permuting rows of said sub-blocks of said second block, and said fourth block being obtained by permuting columns of said sub-blocks of said third block; and wherein the pattern is given by at least one of matrix $FA_1$ or matrix $FA_2$:

$$FA_1 = \begin{matrix} a & c & d & b \\ b & d & c & a \\ c & a & b & d \\ d & b & a & c \end{matrix} \quad FA_2 = \begin{matrix} a & b & c & d \\ c & d & a & b \\ d & c & b & a \\ b & a & d & c \end{matrix}$$

where a, b, c and d are filter elements.

20. The device of claim 19, wherein said pattern is replicated at least twice to cover a surface of the pixels sensor.

* * * * *